(12) United States Patent
Schmidt

(10) Patent No.: US 6,452,088 B1
(45) Date of Patent: Sep. 17, 2002

(54) POWER GENERATING DISPLAY

(75) Inventor: Dominik J. Schmidt, Palo Alto, CA (US)

(73) Assignee: Airify Communications, Inc., Stanford, CA (US)

(*) Notice: Subject to any disclaimer, the term of this patent is extended or adjusted under 35 U.S.C. 154(b) by 0 days.

(21) Appl. No.: 09/836,111

(22) Filed: Apr. 16, 2001

(51) Int. Cl.$^7$ .............................................. H01L 31/042
(52) U.S. Cl. ................... 136/244; 136/291; 136/246; 136/261; 257/431; 257/447; 349/28; 349/43
(58) Field of Search ....................... 136/244, 251, 136/246, 258, 261, 291, 293; 257/82–85, 80, 184, 443, 444, 448, 459, 460, 461, 447; 349/27, 28, 43

(56) References Cited

U.S. PATENT DOCUMENTS

| | | | | |
|---|---|---|---|---|
| 5,243,332 A | * | 9/1993 | Jacobson | 345/44 |
| 5,289,998 A | * | 3/1994 | Bingley et al. | 244/173 |
| 5,523,776 A | * | 6/1996 | Hougham et al. | 345/211 |
| 5,585,951 A | | 12/1996 | Noda et al. | 349/122 |
| 5,800,956 A | | 9/1998 | Minemura et al. | 430/60 |
| 6,124,919 A | * | 9/2000 | Kubo et al. | 349/162 |
| 6,150,692 A | * | 11/2000 | Iwanaga et al. | 257/315 |
| 6,297,442 B1 | * | 10/2001 | Yagi et al. | 136/256 |

OTHER PUBLICATIONS

How Solar Cells Work at www.howstuffworks.com/solar–cell1.htm.

* cited by examiner

Primary Examiner—Nam Nguyen
Assistant Examiner—Brian L Mutschler
(74) Attorney, Agent, or Firm—Tran & Associates

(57) ABSTRACT

A power-generating active-matrix display includes a first region having a plurality of solar cells arranged in a matrix; and a second region having a plurality of thin film transistors, each of which is associated with a pixel electrode and wherein the solar cells overlie respective pixel electrodes.

17 Claims, 2 Drawing Sheets

POWER GENERATING DISPLAY

BACKGROUND

This invention relates to a power generating display.

Computers and electronic devices typically present visual information to users through display devices. In particular, liquid crystal displays (LCDs) are used extensively in watches, calculators, radios, laptop computers and, more recently, in flat screen and projection television systems. For desktop applications, LCD monitors provide a number of benefits; sharp text, thin profile, lower power consumption, less heat generation, and no VLF or ELF emissions to raise health concerns. Small size has always made LCD monitors popular in settings, such as financial and medical installations, where space is at a premium. But a number of other factors are also in their favor. LCD monitors are direct-address displays, which means that each pixel corresponds to a physical display component in the panel. Consequently, images are displayed with greater precision than in a CRT. And since the LCD cells are always in perfect alignment and position, they do not suffer from problems with screen geometry (such as pincushion distortion) or convergence error, which occurs when an imperfect electron beam creates halos around the edges of an on-screen object. For portable applications, LCDs offer significant power and weight reduction over corresponding cathode ray tube (CRT) displays.

Current displays are predominantly Active Matrix Liquid Crystal Displays (AMLCDs). These displays typically require a light source that emits light from behind them. Further, they also absorb a significant amount of this light, so only a portion of available light gets through to the display. As display devices represent a significant portion of the power consumption for a typical portable machine, display devices with low power consumption are needed. Further, due to the excessive heat generation of CRTs, even desktop computers require low-power and thin display devices.

SUMMARY

In one aspect, a power-generating active-matrix display includes a first region having a plurality of solar cells arranged in a matrix; and a second region having a plurality of thin film transistors, each of which is associated with a pixel electrode and wherein the solar cells overlie respective pixel electrodes.

Implementations of the above aspect may include one or more of the following. The solar cells of the power-generating active-matrix display are electrically coupled together. The solar cells can capture photons from a photon source external to the display. The display can include a backlight positioned below the solar cells and the pixel electrodes, and the solar cells can capture photons from the backlight. The solar cells allow radiation from the backlight to go through the pixel electrodes. The solar cells can transmit light from the backlight while capturing photons from a photon source external to the display. The solar cells can have a thickness that is a quarter wavelength of light to enhance reflection of light from a conductive film below. The solar cells can be amorphous silicon (a-Si) cells. The solar cells and the thin film transistors can reside on one layer. A plurality of facing electrodes are positioned below the pixel electrodes, and a liquid crystal layer is positioned between the facing electrodes and the pixel electrodes, wherein the facing electrodes and the pixel electrodes apply a vertical electric field to the liquid crystal layer. A plurality of second solar cells can be arranged in a matrix and occupying the same layer as the polarizer above the facing electrodes. The polarizer absorbs 50% of the incoming light, so it is well suited for solar collection. Each facing electrode can include red, blue and green filters and electrodes to display color. The red, blue and green electrodes can be disposed in a delta-arrangement. A voltage regulator can be connected to the plurality of solar cells to provide regulated power. The device includes an antireflecting coat (ARC). The ARC transmits lights under the display to a viewer and reflects sunlight to amorphous silicon, effectively acting as a two way mirror. More than one layer of the solar cells can be stacked to increase collection and reflection efficiency.

In another aspect, a method for displaying an image and generating power includes transmitting light using an anti-reflecting coating under the display to a viewer; and reflecting sunlight to an amorphous silicon solar cell embedded in the display. The power output of the amorphous silicon can be collected and regulated.

Advantages of the invention may include one or more of the following. The power-generating LCD emits light without requiring external power when sunlight is shining on the LCD. The LCD reflects the bulk of the light to the user's eye. This is achieved by incorporating a solar cell in the display, wherein the solar cell captures light from the ambient to provide backlight or to recharge the batteries. The solar cell also recycles some of the power spent by the LCD backlights. The display also efficiently utilizes absorbed backlight and generates useful power from the backlight by recycling the energy absorbed by the polarizer. A high performance, low overhead system for wireless communication system expanding the functionality and capabilities of a computer system is provided. The system effectively combines multiple components required to generate power and display images into a single integrated circuit device. The complete integration of components greatly reduces manufacturing costs. The system provides for fast, easy migration of existing designs to high performance, high efficiency single chip solutions.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION

Figure 1:
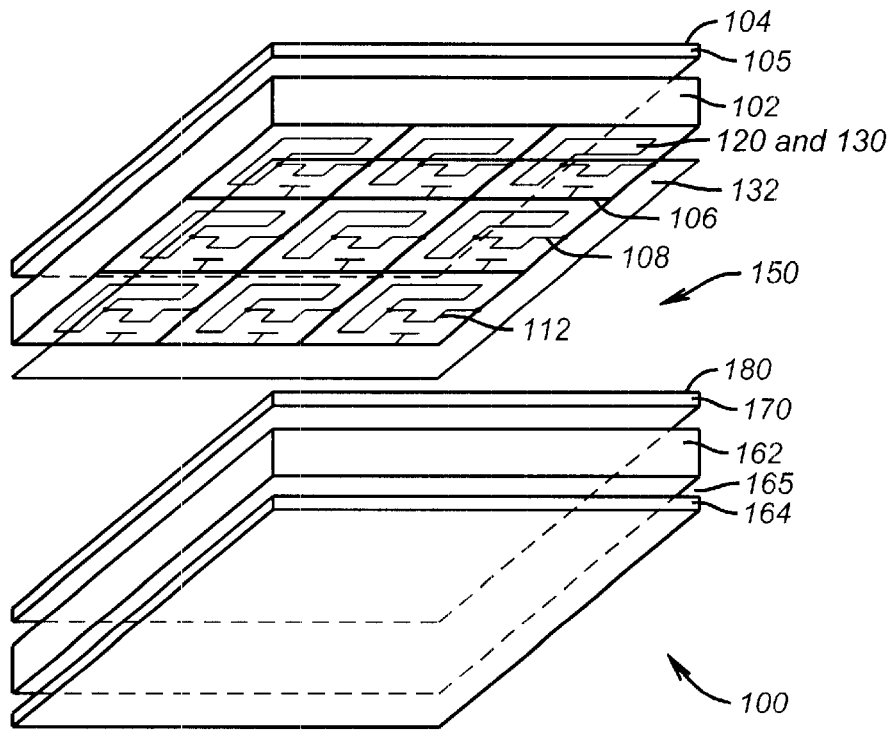
FIG. 1 is a block diagram of a power generating display.

FIG. 1 shows one exemplary LCD 100 that is formed by placing first and second glass substrates or plates 102 and 162 close to one another with a small gap formed between the plates 102 and 162. The first and second glass plates 102 and 162 are independently processed, and the processing of each plate includes the deposition of various layers, device patterning and other techniques. After the plates 102 and 162 are processed, they are mated together and a liquid crystal material 150 is injected into the gap between the plates.

The first glass plate 102 has a polarizing film 104 on its outer surface. A spacer layer 105 can be provided between the polarizing film 104 and the glass plate 102. On the inner surface of the plate 102, a transparent electrical conductor 106 is deposited. The transparent conductor 106 is patterned into a series of mutually perpendicular lines (row and column lines) that designate a plurality of cells or pixels 108. One or more switching devices 112 are connected to the individual pixel electrodes 120. The pixel electrodes 120 can be made of, for example, ITO (indium tin oxide) that is superposed on one end of a drain electrode of a suitable switching device on a superposed semiconductor layer. The pixel electrode 120 is deposited or formed in a predetermined region in the cell and separated from an adjacent pixel electrode 120 by such an extent of gap that they can be electrically insulated from each other. The reflection from the ITO layer can be enhanced or degraded by including collection layers with a thickness a specific fraction of the incoming light wavelength.

The switching devices 112 can be thin film transistors (TFT). In each TFT, a drain electrode is connected to the corresponding pixel electrode 120; a source electrode is connected to a signal line; and a gate electrode is connected to a gate line. The TFT drives the pixel electrode 120 to cause a pixel to be turned on and off to display a portion of the image on the screen by applying a voltage to the pixel electrode 120. The voltage controls the orientation state of the liquid crystal 150 so that light entering from the other substrate is allowed to pass through or blocked. The switching devices 112 apply a voltage for displaying to the picture element electrode. This voltage controls the orientation state of the liquid crystal so that light entering from the other substrate is allowed to pass through or be blocked. Light which has passed through the liquid crystal layer is reflected by the picture element electrode which is a reflector and then emitted from the display device, resulting in a bright display. When the entering light is blocked a dark display is obtained.

Deposited on the same layer as the TFT and above the pixel electrode 120 is a transparent power-generating element 130. In one embodiment, the power generating element 130 is a semiconductor layer made using an amorphous silicon (a-Si) photodiode that generates photoelectric current. In this embodiment, light is absorbed only from the surface and in areas where the LCD is 'off' using an antireflective coating 132. The coating 132 transforms the device into a 2-way mirror. The anti-reflective coating can consist of the amorphous silicon layer itself. By carefully choosing the layer thicknesses, light coming from under the silicon layer will be transmitted, while sunlight will be reflected and diffused back into the amorphous silicon layer.

The coating 132 can be implemented using a number of techniques known to those skilled in the art. For example, the transmission and reflection type liquid crystal panel (half reflection type liquid crystal panel) shown in U.S. Pat. No. 6,124,919 can be used in both the reflection mode and the transmission mode. In such a liquid crystal panel, the outdoor daytime light which enters through the top side substrate as an incident light is reflected and thereafter is emitted from the upper substrate so as to visualize an image, and the light irradiated from the backlight disposed behind the liquid crystal panel is transmitted through the lower and upper substrates and is emitted from the upper substrate so as to visualize the image. Photons contained in the transmitted and reflected light is captured as energy. The a-Si has a junction that includes n-type and p-type silicon. When light strikes the power generating element 130, a certain portion of light is absorbed within the semiconductor material. The energy of the absorbed light knocks electrons loose, generating electron-hole pairs which can flow freely. Under normal conditions, when the holes and electrons mix at the junction between n-type and p-type silicon, they mix and form a barrier, making it difficult for electrons on the n side to cross to the p-side. When light, in the form of photons, hits the cell, its energy frees electron-hole pairs. Each photon will enough energy will normally free on electron, and result in a free hole as well. If this happens close enough to the electric field, or if they happen to diffuse into its range of influence, the field will send the electron to the n side, and the hole to the p side. When equilibrium is reached, an electric field is formed separating the two sides. This field will push any free holes and electrons out of the junction contacts, effectively mimicking a battery. Through an external current path, electrons flow through the path to their original side (the p side) to unite with holes the electric field sent there. The electron flow provides the current, and the cell's electric field generates a voltage. The collective current from all power generating elements 130 is summed and is available to power the LCD or other active elements. In one embodiment, the collective output of the power generating elements 130 is provided to a power regulator (not shown) to provide a clean source of power to the LCD or other computing elements.

Turning now to the second glass substrate or plate 162, the second glass plate 162 also has a polarizing film 164 on its outer surface. A spacer layer 165 can be provided between the polarizing film 164 and the glass plate 162. The facing electrodes 170 can be made of, for example, ITO (indium tin oxide) that is superposed on one end of a drain electrode of a suitable switching device on a superposed semiconductor layer. The facing electrodes 170 apply a vertical electric field to the liquid crystal layer 150. In addition, the second glass substrate or plate 162 includes a color filter layer with segments divided into the primary colors, that is, red, green and blue. The segment are each matched with the pixel electrodes 120. The pixel electrodes 120 and the facing electrodes 170 generate a vertical electric field such that the molecular alignment of the liquid crystal layer 150 is changed.

The gap between the plates 102 and 162 is filled with the liquid crystal layer 150 such as a liquid crystal polymer material, typically a cyanobiphenyl with the ability to rotate the direction of polarized light. Polarization direction follows the physical rotation of the liquid crystal molecules, i.e., the direction of the long axis of the molecules. The liquid crystal material is used which forms loosely organized chains that rotate from one side of the gap to the other side. As such chains rotate or "twist," so do the axes of the individual liquid crystal molecules. Light, which is polarized as it passes through the polarizing film 164, has its polarization direction rotated following the physical rotation of the liquid crystal polymer molecules as the light passes through the cell. The polarizing film 104 on the top side of the display passes light that has had it polarization direction rotated in the manner described. Viewed from the top, such a cell is clear, or transmitting. The alignment of the liquid crystal molecules, and, hence, the polarization direction of light passing through the liquid crystal, can be changed by applying an external electric field. Applying a voltage across the cell gap by addressing the appropriate line on each side of the cell causes the chains of liquid crystal molecules to align themselves with the applied electric field, "untwisting" as they align. Since the polarization direction of light passing through such "untwisted" liquid crystal polymer is not rotated, such light is blocked from exiting the cell by the polarizing field, which passes only rotated light. Such a cell appears dark from the exit side. When the voltage is turned off, the liquid crystal returns to its original state, and the pixel is clear again.

In one embodiment, the TFT is made of a-Si with junctions that include n-type and p-type silicon so that power is generated by the TFT. When light strikes the power generating element 130, a certain portion of light is absorbed within the semiconductor material and electrons flow through the path to their original side (the p side) to unite with holes the electric field sent there. The electron flow provides the current, and the cell's electric field generates a voltage. In another embodiment, deposited on the same layer as the TFT and above the facing electrode 170 is a second transparent power-generating element 180. In one embodiment, the power generating element 180 is a semiconductor layer made of amorphous silicon (a-Si) that generates photoelectric current. When light strikes the power generating element 180, a certain portion of light is absorbed within the semiconductor material and electrons flow through the pair to their original side (the p side) to unite with holes the electric field sent there. The electron flow provides the current, and the cell's electric field generates a voltage. The collective current from all power generating elements 180 is summed and is available to power the LCD or other active elements. The collective output of the power generating elements 130 and 180 is provided to the power regulating the output of the power generating elements 130 to provide a clean source of power to the LCD or other computing elements.

Although not shown in this embodiment, a backlight is disposed on a planar surface of the liquid crystal display 100 so as to construct the liquid crystal display device. In one embodiment, the backlight includes a light guide plate which is made of a transparent acrylic plate provided with a surface treatment for giving the light directivity to the plate, a linear lamp such as a cold cathode fluorescent tube arranged along one side of the light guide plate and a reflection sheet.

Although FIG. 1 shows a liquid crystal panel for a monochromatic display, the panel can be converted to the one for a color display by merely providing three color filters to the inner surface of the upper substrate or the lower substrate.

Figure 2:
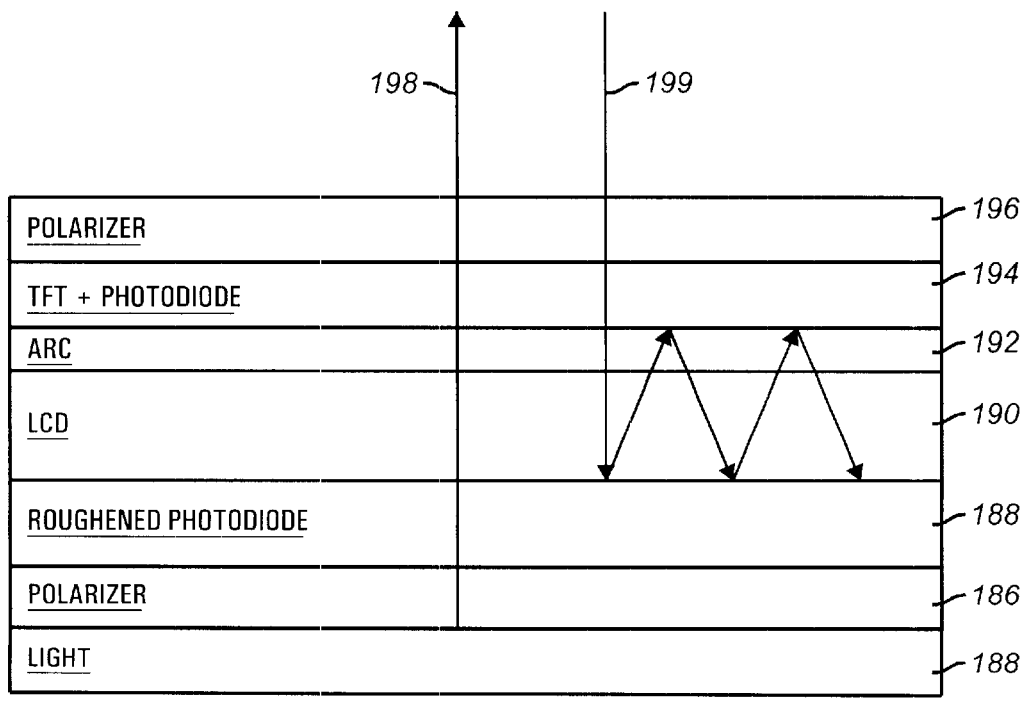
FIG. 2 is a diagram illustrating exemplary light reflection and light transmission properties of the power generating display of FIG. 1.

FIG. 2 shows a second embodiment of the power generating display. In this embodiment, a backlight 184 is positioned at the bottom. Above the backlight 184 is a polarizer 186. Next, a photodiode layer 188 is provided. The photodiode layer 188 generates power for the assembly of FIG. 2. Next, an LCD layer 190 controls the pixel display for the assembly. An anit-reflective coating (ARC) layer 192 is provided to selectively transmit or reflect light. Above the ARC layer 192 is a layer 194 with thin film transistor for selectively turning on and off the pixel and photodiode for power generation. Finally, a polarizer layer 196 is positioned above the layer 194.

In FIG. 2, ray 199 is outdoor daytime light such as solar light, and ray 199 indicates the light reflected by the ARC layer 192. Ray 198 is the light irradiated from the lighting device 184 before passing through the ARC layer 192.

Another embodiment of the invention uses a photoactive, doped liquid crystal such as crystals with titanyl phthalocyanines (TiOPc). TiOPc is quite suitable as a photoreceptive material for liquid crystal diodes because TiOPc has sufficient light sensitivity at long wavelength region between 600 nm to 850 nm. The crystal can be formed by distributing a charge generation material (CGM) in a resin, among others. As for such CGM, for example, inorganic photoconductive materials such as selenium or alloys thereof, CdS, CdSe, CdSSe, ZnO, ZnS, metal or non-metal phthalocyanine compounds; azo compounds such as bisazo compounds, trisazo compounds, such as squarium compounds, azurenium compounds, perylene compounds, indigo compounds, quinacridone compounds, polyquinonetype compounds, cyanine dyes, xanthene dyes and transportation complexes composed of poly-N-carbazoles and trinitrofluorenone can be used. These compounds may be used either individually or two or more kinds in combination. The crystal becomes opaque when the electrodes force a voltage across it, meaning that photons are captured inside the crystal. The photons generate electron-hole pairs similar to those in a solar cell. The generated electron hole pairs flow to the biasing terminals, effectively supplying power. In this embodiment, no special coatings are needed, since light does not need to be preferentially reflected, and is only absorbed in pixels that are intentionally opaque. The pixel addressing circuitry turns pixel into an opaque state by applying a voltage across the pixel. This pixel can then capture all light impinging upon it from both the backlight and top without affecting the contrast of the display. In this embodiment, the more photons absorbed in the dark pixels, the higher the resulting contrast. Thus, by using appropriate photoactive liquid crystal, a portion of the absorbed photons can be turned into usable electrical power.

The above embodiments of power generating display can recycle a significant amount of energy needed to run the LCD screen and would also provide sufficient current to trickle charge a standard cell battery. Thus, by wearing a portable appliance incorporating the power generating display, a user can extend the battery life of the portable appliance. Further, in embodiments with photoactive LCDs and selectively transmissive LCDs, touch-sensitive capabilities can be provided inexpensively. In each of these LCDs, the stylus is sensed by changes in light intensity rather than capacitively or piezoelectrically.

Figure 3:
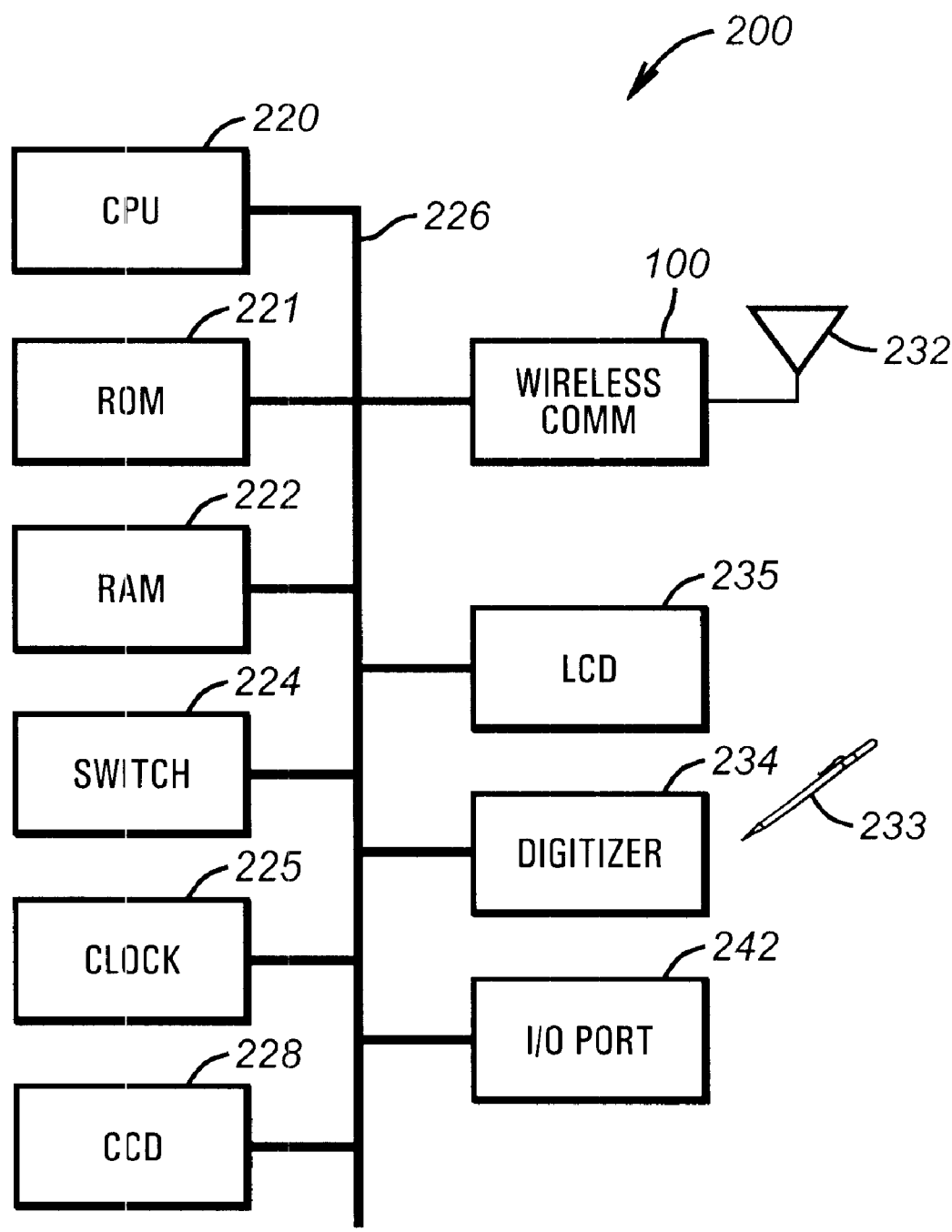
FIG. 3 is a block diagram of a portable computer system for providing data processing using the power generating display of FIG. 1.

FIG. 3 illustrates an exemplary computer system 200 with the wireless communication device 101. The computer system 200 is preferably housed in a small, rectangular portable enclosure. Referring now to FIG. 3, a general purpose architecture for entering information into the data management by writing or speaking to the computer system is illustrated. A processor 220 or central processing unit (CPU) provides the processing capability. The processor 220 can be a reduced instruction set computer (RISC) processor or a complex instruction set computer (CISC) processor. In one embodiment, the processor 220 is a low power CPU such as the MC68328V DragonBall device available from Motorola Inc.

The processor 220 is connected to a read-only-memory (ROM) 221 for receiving executable instructions as well as certain predefined data and variables. The processor 220 is also connected to a random access memory (RAM) 222 for storing various run-time variables and data arrays, among others. The RAM 222 is sufficient to store user application programs and data. In this instance, the RAM 222 can be provided with a back-up battery to prevent the loss of data even when the computer system is turned off. However, it is generally desirable to have some type of long term storage such as a commercially available miniature hard disk drive, or non-volatile memory such as a programmable ROM such as an electrically erasable programmable ROM, a flash ROM memory in addition to the ROM 221 for data back-up purposes.

The computer system 200 has built-in applications stored in the ROM 221 or downloadable to the RAM 222 which include, among others, an appointment book to keep track of meetings and to-do lists, a phone book to store phone numbers and other contact information, a notepad for simple word processing applications, a world time clock which shows time around the world and city locations on a map, a database for storing user specific data, a stopwatch with an alarm clock and a countdown timer, a calculator for basic computations and financial computations, and a spreadsheet for more complex data modeling and analysis. Additionally, project planning tools, and CAD/CAM systems, Internet browsers, among others, may be added to increase the functionality of portable computing appliances. Users benefit from this software, as the software allows users to be more productive when they travel as well as when they are in their offices.

The computer system 200 receives instructions for the user using one or more switches such as push-bottom switches in a keypad 224. The processor 220 is also connected to a real-time clock/timer 225 that tracks time. The clock/timer 225 can be a dedicated integrated circuit for tracking the real-time clock data, or alternatively, the clock/timer 225 can be a software clock where time is tracked based on the clock signal clocking the processor 220. In the event that the clock/timer 225 is software-based, it is preferred that the software clock/timer be interrupt driven to minimize the CPU loading. However, even an interrupt-driven software clock/timer 225 requires certain CPU overhead in tracking time. Thus, the real-time clock/timer integrated circuit 225 is preferable where high processing performance is needed.

The processor 220 drives an internal bus 226. Through the bus 226, the computer system can access data from the ROM 221 or RAM 222, or can acquire I/O information such as visual information via a charged coupled device (CCD) 228. The CCD unit 228 is further connected to a lens assembly (not shown) for receiving and focusing light beams to the CCD for digitization. Images scanned via the CCD unit 228 can be compressed and transmitted via a suitable network such as the Internet, through Bluetooth channel, cellular telephone channels or via facsimile to a remote site.

Additionally, the processor 220 is connected to the multi-mode wireless communicator device 101, which is connected to an antenna 232. The device 101 satisfies the need to access electronic mail, paging, mode/facsimile, remote access to home computers and the Internet. The antenna 232 can be a loop antenna using flat-strip conductors such as printed circuit board wiring traces as flat strip conductors have lower skin effect loss in the rectangular conductor than that of antennas with round-wire conductors. One simple form of wireless communication device 110 is a wireless link to a cellular telephone where the user simply accesses a cellular channel similar to the making of a regular voice call. Also mention that one channel is reserved for making voice calls. Typically, data channels are not usable for voice communications because of the latency and low packet reliability, so a dedicated voice channel is necessary. In one implementation, GPRS, there are a total of 8 channels per user, one of which is dedicated to voice when the user decides to make a voice call. This voice connection is independent of the data connection.

The processor 220 of the preferred embodiment accepts handwritings as an input medium from the user. A digitizer 234, a pen 233, and a display LCD panel 235 are provided to capture the handwriting. Preferably, the digitizer 234 has a character input region and a numeral input region that are adapted to capture the user's handwritings on words and numbers, respectively. The LCD panel 235 can be the power-generating display of FIG. 1 and has a viewing screen exposed along one of the planar sides of the enclosure are provided. The digitizer 234 can simply be a ADC that senses voltage produced by the solar cells that indicate changes in light intensity as a stylus moves. The assembly combination of the digitizer 234, the pen 233 and the LCD panel 235 serves as an input/output device. When operating as an output device, the screen 235 displays computer-generated images developed by the CPU 220. The LCD panel 235 also provides visual feedback to the user when one or more application software execute. When operating as an input device the digitizer 234 senses the position of the tip of the stylus or pen 233 on the viewing screen 235 and provides this information to the computer's processor 220. In addition to the vector information, the present invention contemplates that display assemblies capable of sensing the pressure of the stylus on the screen can be used to provide further information to the CPU 220.

The CPU 220 accepts pen strokes from the user using the stylus or pen 233 that is positioned over the digitized 234. As the user "writes," the position of the pen 233 is sensed by the digitizer 234 via an electromagnetic field as the user writes information to the computer system. The digitizer 234 converts the position information to graphic data. For example, graphical images can be input into the pen-based computer by merely moving the stylus over the surface of the screen. As the CPU 220 senses the position and movement of the stylus, it generates a corresponding image on the screen to create the illusion that the pen stylus is drawing the image directly upon the screen. The photoactive liquid crystal display mentioned in one of the embodiments above can also be used as a digitizer plate, since the photoactive compound will respond to the user's stylus moving across it. Such a light sensing display would be more sensitive to the stylus than the standard touch LCDs which rely on capacitive or piezoelectric effects.

The data on the position and movement of the stylus is also provided to handwriting recognition software, which is stored in the ROM 221 and/or the RAM 222. The handwriting recognizer suitably converts the written instructions from the user into text data suitable for saving time and expense information. The process of converting the pen strokes into equivalent characters and/or drawing vectors using the handwriting recognizer is described below.

The computer system is also connected to one or more input/output (I/O) ports 242 which allow the CPU 220 to communicate with other computers. Each of the I/O ports 242 may be a parallel port, a serial port, a universal bus (USB) port, a Firewire port, or alternatively a proprietary port to enable the computer system to dock with the host computer. In the event that the I/O port 242 is housed in a docking port, after docking, the I/O ports 242 and software located on a host computer (not shown) support an automatic synchronization of data between the computer system and the host computer. During operation, the synchronization software runs in the background mode on the host computer and listens for a synchronization request or command from the computer system 200 of the present invention. Changes made on the computer system and the host computer will be reflected on both systems after synchronization. Preferably, the synchronization software only synchronizes the portions of the files that have been modified to reduce the updating times. The I/O port 242 is preferably a high speed serial port such as an RS-232 port, a Universal Serial Bus, or a Fibre Channel for cost reasons, but can also be a parallel port for higher data transfer rate.

One or more portable computers 200 can be dispersed in nearby cell regions and communicate with a cellular mobile support station (MSS) as well as a Bluetooth™ station. The cellular and Bluetooth™ stations relay the messages via stations positioned on a global basis to ensure that the user is connected to the network, regardless of his or her reference to home. The stations are eventually connected to the Internet, which is a super-network, or a network of networks, interconnecting a number of computers together using predefined protocols to tell the computers how to locate and exchange data with one another. The primary elements of the Internet are host computers that are linked by a backbone telecommunications network and communicate using one or more protocols. The most fundamental of Internet protocols is called Transmission Control Protocol/Internet Protocol (TCP/IP), which is essentially an envelope where data resides. The TCP protocol tells computers what is in the packet, and the IP protocol tells computers where to send the packet. The IP transmits blocks of data called datagrams from sources to destinations throughout the Internet. A packets of information travel across the Internet, routers throughout the network check the addresses of data packages and determine the best route to send them to their destinations. Furthermore, packets of information are detoured around non-operative computers if necessary until the information finds it way to the proper destination.

The Web is based on a client/server model where Web pages reside on host computers that "serve up" pages when the user's computer (client computer) requests them. As the user "surfs" the Web, a browser can request data from the database on a server computer that processes and replies the desired back to the computer system of FIG. 2 and to display that request when the request is fulfilled by the server. The client computer runs a browser software which asks for specific information by sending a HTTP request across the Internet 150 connection to the host computer. When the host computer receives the HTTP request, it responds by sending the data back to the client.

The browser commonly features a graphical user interface with icons and menus across the top along with a field to supply the URL for retrieval purposes. Navigational buttons guide the users through cyberspace in a linear manner, either one page forward or backward at a time. Pull down menus provide a history of sites accessed so that the user can revisit previous pages. A stop button is typically provided to cancel the loading of a page. To preserve favorite sites, a bookmark is provide to hold the user's favorite URLs in a list such as a directory tree. Furthermore, the browser typically provides a temporary cache on the data storage device or in RAM. The cache allows a more efficient Internet access as it saves bandwith and improves access performance significantly. The browser also interprets HyperText Markup Language (HTML) which allows web site creators to specify a display format accessible by HTML compatible browsers.

Typically, when the user types in the URL or clicks on a hyperlink, TCP/IP opens a connection between the host and client computers. The browser then generates a request header to ask for a specific HTML document. The server responds by sending the HTML document as text to the client via the TCP/IP pipeline. The client computer acknowledges receipt of the page and the connection is closed. The HTML document is stored in the browser's cache. The browser then parses the HTML document for text and tags. If the browser runs across tags that link to images/pictures and sounds, the browser makes separate requests for these files to the serve and displays or generates sounds to the user.

To supply more intelligent processing of information over the Internet, a language such as Java may be utilized. Java was developed originally by Sun Microsystems of Mountain View, Calif. The specification for the Java language is stored at the Java web site http://java.sun.com/. The web site contains the Java development software, a HotJava web browser, and on-line documentation for all aspects of the Java language, hereby incorporated by reference. Designed to be small, simple and portable across processor platforms and operating systems, Java can download and play applets on a browser system of the receiver or reader. Applets are Java programs that are downloaded over the Internet World Wide Web, as dictated by a tag such as <applet> tags and executed by a Web browser on the reader's machine. In Java, the compiler takes the instructions and generates bytecodes, which are system independent machine codes. A bytecode interpreter executes the bytecodes. The bytecode interpreter can execute stand-alone, or in the case of applets, the bytecode interpreter is built-in Java compatible browsers. Thus, with a Java compatible client-server, the Internet is transformed from a passive giant book of information into an active network capable of supporting electronic commerce and virtual ecosystems. The computer 200 allows users to move about freely within and between cells while transparently maintaining all connections, particularly with the Internet.

Although specific embodiment of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

What is claimed is:

1. A power-generating active-matrix display, comprising:
 a first region having a plurality of solar cells arranged in a matrix;
 a second region having a plurality of thin film transistors, each of which is associated with a pixel electrode and wherein the solar cells overlie respective pixel electrodes, wherein the solar cells and the thin film transistors reside on one layer.

2. The power-generating active-matrix display of claim 1, wherein the solar cells capture photons from a photon source external to the display.

3. The power-generating active-matrix display of claim 1, further comprising a backlight positioned below the solar cells and the pixel electrodes.

4. The power-generating active-matrix display of claim 3, wherein the solar cells capture photons from the backlight.

5. The power-generating active-matrix display of claim 3, wherein the solar cells allow radiation from the backlight to go through the pixel electrodes.

6. The power-generating active-matrix display of claim 3, wherein the solar cells transmit light from the backlight while capturing photons from a photon source external to the display.

7. The power-generating active-matrix display of claim 1, wherein the solar cells comprise amorphous silicon (a-Si) cells.

8. The power-generating active-matrix display of claim 1, further comprising a plurality of facing electrodes positioned above the pixel electrodes.

9. The power-generating active-matrix display of claim 8, further comprising a liquid crystal layer positioned between the facing electrodes and the pixel electrodes, wherein the facing electrodes and the pixel electrodes apply a vertical electric field to the liquid crystal layer.

10. The power-generating active-matrix display of claim 1, further comprising a voltage regulator coupled to the plurality of solar cells.

11. The power-generating active-matrix display of claim 1, further comprising an antireflecting coat (ARC).

12. The power-generating active-matrix display of claim 11, wherein the ARC transmits lights under the display to a viewer.

13. The power-generating active-matrix display of claim 11, wherein the ARC reflects sunlight to the solar cells, wherein the solar cells comprise amorphous silicon solar cells.

14. The power-generating active-matrix display of claim 11, wherein the ARC is a two way mirror.

15. The power-generating active-matrix display of claim 1, wherein the display tracks stylus movements by detecting changes in incoming light intensity.

16. A method for displaying an image and generating power, comprising:

transmitting lights under a display to a viewer, wherein the display comprises a first region having a plurality of solar cells arranged in a matrix, wherein the solar cells comprise amorphous silicon solar cells, and a second region having a plurality of thin film transistors, each of which is associated with a pixel electrode, wherein the solar cells overlie respective pixel electrodes, and the solar cells and the thin film transistors reside on one layer; and reflecting sunlight to the amorphous silicon solar cells using an antireflecting coat embedded in the display.

17. The method of claim 16, further comprising collecting a power output of the amorphous silicon solar cells and regulating the power output.

* * * * *